(12) United States Patent
Lee et al.

(10) Patent No.: US 9,099,940 B2
(45) Date of Patent: Aug. 4, 2015

(54) PIEZOELECTRIC DRIVING CIRCUIT AND DRIVING METHOD THEREOF

(71) Applicant: FAIRCHILD KOREA SEMICONDUCTOR LTD., Bucheon (KR)

(72) Inventors: Youngsik Lee, Seoul (KR); Eunsung Jang, Suwon-si (KR)

(73) Assignee: Fairchild Korea Semiconductor LTD (KR)

( * ) Notice: Subject to any disclaimer, the term of this patent is extended or adjusted under 35 U.S.C. 154(b) by 168 days.

(21) Appl. No.: 13/964,042

(22) Filed: Aug. 10, 2013

(65) Prior Publication Data

US 2014/0042871 A1 Feb. 13, 2014

(30) Foreign Application Priority Data

Aug. 13, 2012 (KR) .................. 10-2012-0088636

(51) Int. Cl.
*H01L 41/09* (2006.01)
*H02N 2/06* (2006.01)
(52) U.S. Cl.
CPC .................. *H02N 2/067* (2013.01)

(58) Field of Classification Search
CPC ................ F02D 2041/2003; F02D 2041/2051; F02D 41/221; H02N 21/14; H02N 2/067; H01L 41/0906
USPC .............................................. 310/316.03, 317
See application file for complete search history.

(56) References Cited

U.S. PATENT DOCUMENTS

| 7,408,290 B2* | 8/2008 | May et al. ..................... 310/334 |
| 7,705,516 B2* | 4/2010 | Yoshida et al. .......... 310/316.03 |
| 7,932,777 B1* | 4/2011 | Zipfel et al. .................... 330/10 |

* cited by examiner

*Primary Examiner* — Thomas Dougherty
(74) *Attorney, Agent, or Firm* — Grossman Tucker Perreault & Pfleger PLLC

(57) ABSTRACT

A piezoelectric driving circuit generates a first PWM output according to a result of comparison between a ramp signal and a reference sinewave and generates a second PWM according to a result of comparison between the ramp signal and an inverse reference sinewave of the reference sinewave. The switching operation of the first and third switches of the piezoelectric driving circuit are controlled according to the first PWM output and the switching operation of the second and fourth switches of the piezoelectric driving circuit are controlled according to the second PWM output during a first cycle of the reference sinewave and the inverse reference sinewave. The switching operation of the first and third switches are controlled according to the second PWM output and the switching operation of the second and fourth switches are controlled according to the first PWM output during the next second cycle.

20 Claims, 5 Drawing Sheets ically used to charge and discharge a capacitor that forms the 35 and the first gate control signal according to the second PWM
PIEZOELECTRIC DRIVING CIRCUIT AND DRIVING METHOD THEREOF

CROSS-REFERENCE TO RELATED APPLICATION

This application claims priority to and the benefit of Korean Patent Application No. 10-2012-0088636 filed in the Korean Intellectual Property Office on Aug. 13, 2012, the entire contents of which are incorporated herein by reference.

BACKGROUND OF THE INVENTION (a) Field of the Invention

The present invention relates to a piezoelectric driving circuit that drives a piezoelectric element and a method for driving the piezoelectric driving circuit.

(b) Description of the Related Art

A piezoelectric element can convert electric energy to mechanical energy and can convert mechanical energy to electric energy. A full-bridge driving circuit is used to drive the piezoelectric element.

The full-bridge driving circuit supplies a square-wave voltage to the piezoelectric element. For example, the full-bridge driving circuit supplies a first DC voltage in a positive direction and a negative direction to the piezoelectric element. Thus, the square-wave peak-to-peak voltage supplied to the piezoelectric element is two times the first DC voltage.

In this case, when the first DC voltage is supplied to the piezoelectric element in the positive circuit, a current charging the piezoelectric element flows, and when the first DC voltage is supplied to the piezoelectric element in the negative direction, a current that discharges the piezoelectric element flows. The charging current and the discharging current are mostly used to charge and discharge a capacitor that forms the piezoelectric element. That is, whenever a direction of the voltage supplied to the piezoelectric element t is changed, the peak current that charges or discharges the capacitor of the piezoelectric element is generated.

Then, power consumption and noise are increased due to the charging and discharging of the capacitor.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention has been made in an effort to provide a piezoelectric driving circuit that can reduces the peak current and a driving method of the piezoelectric driving circuit.

A piezoelectric driving circuit according to an exemplary embodiment of the present invention includes: a full-bridge circuit including first and third switches connected to a first terminal of a piezoelectric element and second and fourth switches connected to a second terminal of the piezoelectric element; and a switch controller controlling switching operation of the first to fourth switches.

The switch controller generates a first PWM output according to a result of comparison between a ramp signal that controls a switching frequency and a reference sinewave that controls a cycle of a piezoelectric voltage and generates a second PWM according to a result of comparison between the ramp signal and an inverse reference sinewave of the reference sinewave.

The switch controller controls switching operation of the first and third switches according to the first PWM output during a first cycle of the reference seinewave and the inverse reference sinewave and controls switching operation of the second and fourth switches according to the second PWM output.

The switch controller controls switching operation of the first and third switches according to the second PWM output during the next second cycle and controls switching operation of the second and fourth switches according to the first PWM output.

The first switch is connected between a DC voltage and the first terminal of the piezoelectric element, the second switch is connected between the DC voltage and the second terminal of the piezoelectric element, the third switch is connected between the first terminal of the piezoelectric element and a ground, and the fourth switch is connected between the second terminal of the piezoelectric element and the ground.

The switch controller generates an input pulse having a predetermined cycle, and includes a piezoelectric driving element that generates the reference sinewave having a cycle that corresponds to the cycle of the input pulse and the inverse reference sinewave.

One cycle of the reference sinewave and the inverse reference sinewave may be the half of the cycle of the input pulse.

The switch controller further includes: a PWM controller generating the first PWM output by comparing the ramp signal and the reference sinewave and generating the second PWM output by comparing the ramp signal and the inverse reference sinewave; and a logical operator generating a first gate control signal according to the first PWM output and a second gate control signal according to the second PWM output when the input pulse is a first level and generating the second gate control signal according to the first PWM output and the first gate control signal according to the second PWM output when the input pulse is a second level.

The switch controller generates a first gate voltage of the first switch and a third gate voltage of the third switch using the first gate control signal and generates a second gate voltage of the second switch and a fourth gate voltage of the fourth switch using the second gate control signal.

The switch controller further includes a gate driver that generates the first gate voltage of the first switch by inverting the first gate control signal, generates the third gate voltage according to the first gate control signal, generates the second gate voltage of the second switch by inverting the second gate control signal, and generates the fourth gate voltage of the fourth switch according to the second gate control signal.

The PWM controller includes: a first PWM comparator including an inversion terminal to which the ramp signal is input and a non-inversion terminal to which the reference sinewave is input, generating a high-level first PWM output when the input of the non-inversion terminal is higher than the input of the inversion terminal and generating a low-level first PWM output when the input of the non-inversion terminal is lower than the input of the inversion terminal; and a second PWM comparator including an inversion terminal to which the ramp signal is input and a non-inversion terminal to which the inverse reference sinewave is input, generating a high-level second PWM output when the input of the non-inversion terminal is higher than the input of the inversion terminal and generating a low-level second PWM output when the input of the non-inversion terminal is lower than the input of the inversion terminal.

The logical operator includes: a first AND gate performing AND operation with the first PWM output and the input pulse; a second AND gate performing AND operation with the first PWM output and the inverse input pulse; a third AND gate performing AND operation with the second PWM output and the input pulse; a fourth AND gate performing AND operation with the second PWM output and the inverse input pulse; a first OR gate generating the first gate control signal by performing OR operation with an output of the first AND gate and an output of the fourth AND gate; and a second OR gate generating the second gate control signal by performing OR operation with an output of the second AND gate and an output of the third AND gate.

The logical operator further includes an inverter generating the inverse input pulse by inverting the input pulse.

The ramp signal is a sawtooth wave or a triangle wave.

A method for driving a piezoelectric driving circuit including first and third switches connected to a first terminal of a piezoelectric element and second and fourth switches connected to a second terminal of the piezoelectric element according to another exemplary embodiment of the present invention includes: generating a first PWM output according to a result of comparison between a ramp signal that controls a switching frequency and a reference sinewave that controls a cycle of a piezoelectric voltage; generating a second PWM output according to a result of comparison between the ramp signal and an inverse reference sinewave of the reference sinewave; controlling switching operation of the first and third switches according to the first PWM output during a first cycle of the reference sinewave and the inverse reference sinewave; controlling switching operation of the second and fourth switches according to the second PWM output during the first cycle; controlling switching operation of the first and third switches according to the second PWM output during the next second cycle; and controlling switching operation of the second and fourth switches according to the first PWM output during the second cycle.

The method further includes generating an input pulse having a predetermined cycle and generating the reference sinewave having a cycle that corresponds to the cycle of the input pulse and the inverse reference sinewave.

One cycle of the reference sinewave and the inverse reference sinewave may be the half of the cycle of the input pulse.

The generating the first PWM output includes comparing the ramp signal and the reference sinewave and the generating the second PWM output includes comparing the ramp signal and the inverse reference sinewave.

The controlling the switching operation of the first and third switches during the first cycle includes: generating a first gate control signal according to the first PWM output when the input pulse is a first level; generating a first gate voltage of the first switch by inverting the first gate control signal; and generating a third gate voltage of the third switch according to the first gate control signal.

The controlling the switching operation of the second and fourth switches during the first cycle includes: generating a second gate control signal according to the second PWM output when the input pulse is a first level; generating a second gate voltage of the second switch by inverting the second gate control signal; and generating a fourth gate voltage of the fourth switch according to the second gate control signal.

The controlling the switching operation of the first and third switches during the second cycle includes: generating a second gate control signal according to the first PWM output when the input pulse is a second level; generating a second gate voltage of the second switch by inverting the second gate control signal; and generating a fourth gate voltage of the fourth switch according to the second gate control signal.

The controlling the switching operation of the second and fourth switches during the second cycle includes: generating a first gate control signal according to the second PWM output when the input pulse is a second level; generating a second gate voltage of the second switch by inverting the first gate control signal; and generating a fourth gate voltage of the fourth switch according to the first gate control signal.

One cycle of the reference sinewave and the inverse reference sinewave may be the half of the cycle of the input pulse.

The method further includes generating the ramp signal with a sawtooth wave or a triangle wave.

According to the exemplary embodiments of the present invention, a piezoelectric driving circuit that can reduce the peak current, and a driving method of the same can be provided. Accordingly, an additional circuit for reducing the peak current may not be required.

DETAILED DESCRIPTION OF THE EMBODIMENTS

Figure 1:
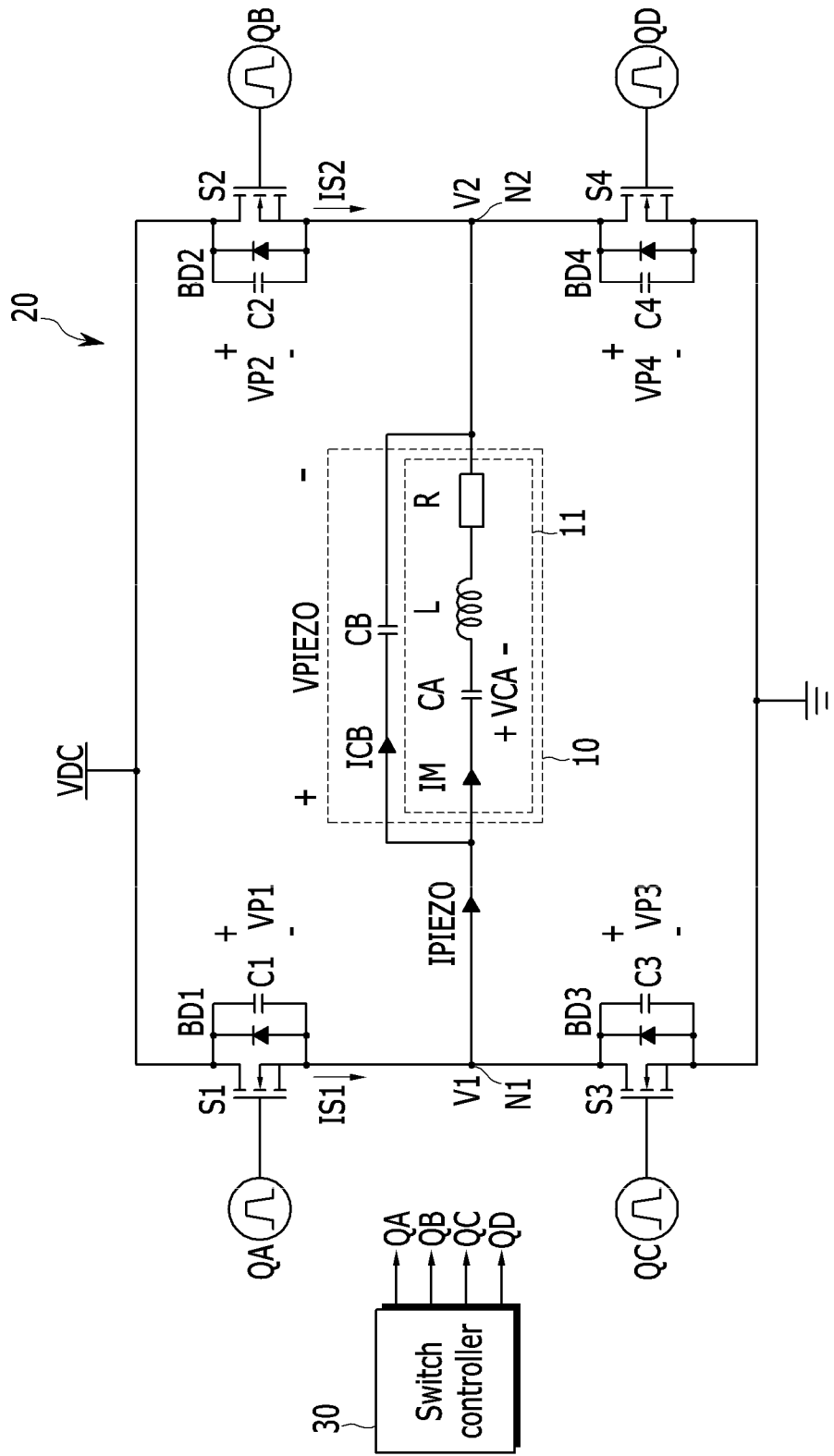
FIG. 1 shows a piezoelectric driving circuit according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a piezoelectric driving circuit and a piezoelectric driving method according to an exemplary embodiment of the present invention will be described with reference to the accompanying drawings.

FIG. 1 shows a piezoelectric element and a piezoelectric driving circuit according to an exemplary embodiment of the present invention.

A piezoelectric element 10 connected to a piezoelectric driving circuit 20 shown in FIG. 1 includes a series-resonance circuit 11 including a first inductor L, a first capacitor CA, and a resistor R and a second capacitor CB coupled to the series-resonance circuit 11 in parallel.

In FIG. 1, the piezoelectric element 10 is exemplarily illustrated as an equivalent circuit. That is, the piezoelectric driving circuit 20 according to the exemplary embodiment of the present invention is not limited to the piezoelectric element 10 shown in FIG. 1, and the piezoelectric element may be realized as another equivalent circuit.

The piezoelectric driving circuit 20 is realized as a full-bridge circuit, and includes four switches S1 to S4. Body diodes BD1 to BD4 and parasitic capacitors C1 to C4 are coupled in parallel to both electrodes of each of the four switches S1 to S4. The piezoelectric driving circuit 20 is connected with a DC voltage VDC and a ground.

A switch connected to the DC voltage VDC is called an upper side switch and a switch connected to the ground is called a lower side switch. For example, the first and second switches S1 and S2 are the upper side switches and the third and fourth switches S3 and S4 are the lower side switches.

The first to fourth switches S1 to S4 according to the exemplary embodiment of the present invention are realized as n-channel type MOSFETs. A first electrode of each of the first to fourth switches S1 to S4 is a drain electrode, a second electrode is a source electrode, and a control electrode is a gate electrode. However, the first to fourth switches according to the exemplary embodiment of the present invention are not limited to the MOSFET, and they may be realized as BJT or IGBT.

A source electrode of the first switch S1 and a drain electrode of the third switch S3 are connected to a node N1, and a source electrode of the second switch S2 and a drain electrode of the fourth switch S4 are connected to a node N2. The node N1 and the node N2 are output terminals of the piezoelectric driving circuit 20, and the piezoelectric element 10 is connected between the node N1 and the node N2.

In the piezoelectric element 10, the first capacitor CA, the first inductor L, and the resistor R are coupled in series between the node N1 and the node N2. The first capacitor CA, the first inductor L, and the resistor R coupled series-form the series-resonance circuit 11. The second capacitor CB is connected between the node N1 and the node N2, and connected with the series-resonance circuit in parallel.

A current IM is a current flowing to the series-resonance circuit, a current ICB is a current flowing to the second capacitor CB, and a piezoelectric current IPIEZO is a current supplied to the piezoelectric element 10 and equivalent to the sum of the current IM and the current ICB.

In further detail, a first end of the first capacitor CA is connected to the node N1. A first end of the first inductor L is connected to a second end of the first capacitor CA. A first end of the resistor R is connected to a second end of the first inductor L, and a second end of the resistor R is connected to the node N2.

A drain electrode of each of the first switch S1 and the second switch S2 is connected to the voltage VDC, and a source electrode of each of the third switch S3 and the fourth switch S4 is connected to the ground.

A gate electrode of the first switch S1 is supplied with a first gate voltage VA and a gate electrode of the second switch S2 is supplied with a second gate voltage VB. A gate electrode of the third switch S3 is supplied with a third gate voltage VC and a gate electrode of the fourth switch S4 is supplied with a fourth gate voltage VD.

The switch controller 30 generates a reference sinewave SIN and an inverse reference sinewave RSIN, and generates first to fourth gate voltages QA, QB, QC, and QD for controlling switching operation of the first to fourth switches S1 to S4 using a ramp signal having a predetermined frequency. The reference sinewave SIN is determined by a rectification sinewave, and the inverse reference sinewave may be a waveform inversed from the reference sinewave SIN. The ramp signal may be a sawtooth wave or a triangle wave. In the exemplary embodiment of the present invention, the ramp signal is set to the sawtooth wave.

A cycle of the reference sinewave SIN and a cycle of the inverse reference sinewave RSIN may control a cycle of the piezoelectric voltage VPIEZO, and the ramp signal may control the switching frequency. In further detail, the switch controller 30 generates an input pulse INP for controlling the cycle of the piezoelectric voltage VPIEZO, and generates a reference winewave SIN and the inverse reference sinewave RSIN of which a cycle is the half of the cycle of the input pulse INP. In this case, the reference sinewave SIN and the inverse reference sinewave RSIN are inverse to each other with reference to a predetermined reference voltage. The reference voltage is the middle of the peak and the lowest value of the sawtooth wave SAW. A frequency of the sawtooth SAW determines switching frequencies of the first to fourth switches.

Hereinafter, the switch controller 30 according to the exemplary embodiment of the present invention will be described with reference to FIG. 2.

Figure 2:
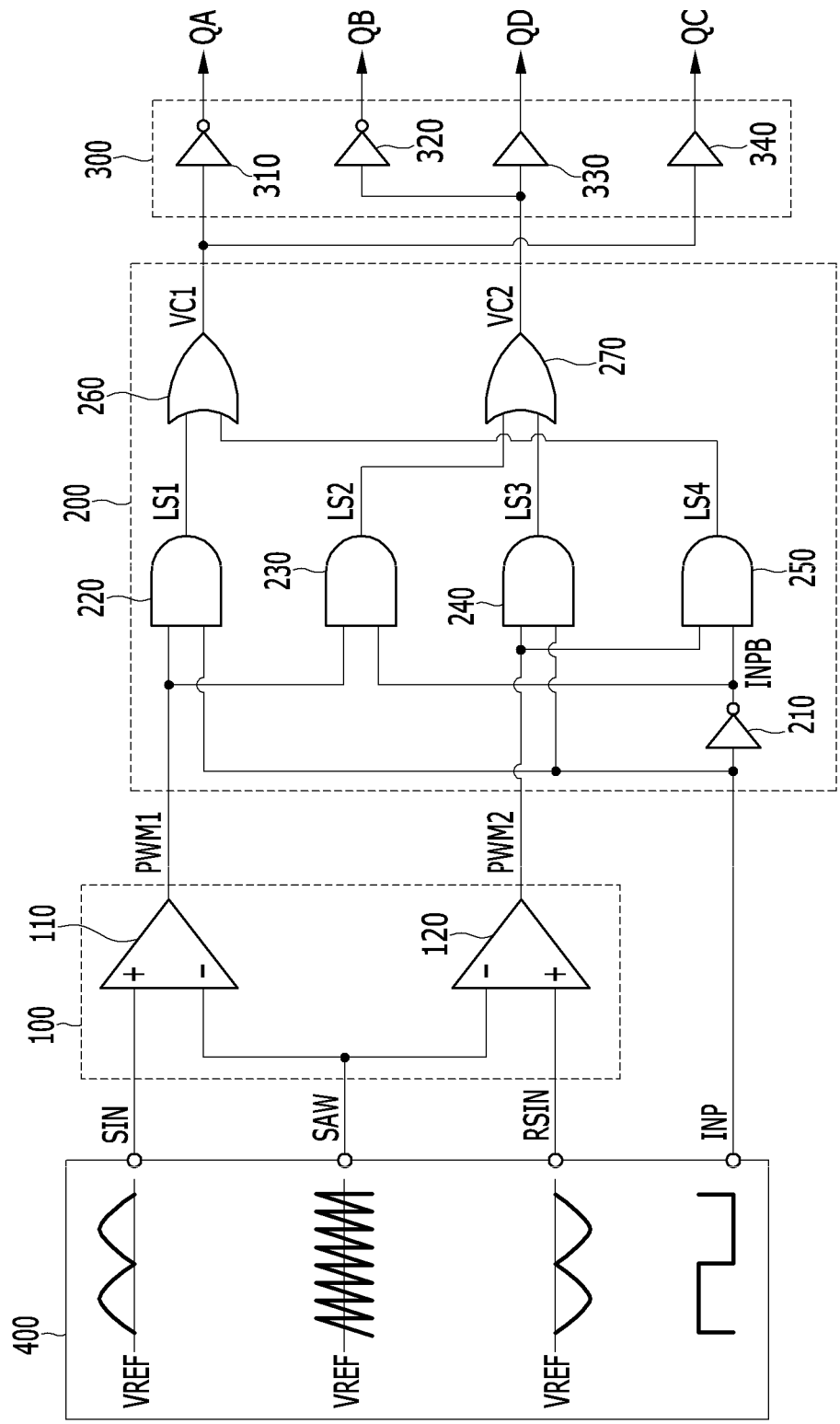
FIG. 2 shows a switch controller according to the exemplary embodiment of the present invention.

FIG. 2 shows the switch controller according to the exemplary embodiment of the present invention.

As shown in FIG. 2, the switch controller 30 includes a PWM controller 100, a logical operator 200, a gate driver 300, and a signal generator 400.

The signal generator 400 generates an input pulse INP, a reference sinewave SIN, an inverse reference sinewave RSIN, and a sawtooth wave SAW. The signal generator 400 generates the input pulse INP of which a cycle is the same as one cycle CT0 of the piezoelectric voltage VPIEZO, and generates a sawtooth wave SAW for controlling the switching frequency.

The signal generator 400 generates the reference sinewave SIN and the inverse reference sinewave RSIN of which one cycle CT1 is the half cycle of the input pulse INP. The signal generator 400 may convert a digital signal increasing during a half cycle CT2 of the cycle CT1 into an analog voltage, and may generate the reference sinewave SIN by converting a digital signal decreasing during the other half cycle CT3 into an analog voltage.

In addition, the signal generator 400 may convert a digital signal decreasing during the half cycle CT2 of the cycle CT1 into an analog voltage, and may generates the inverse reference sinewave RSIN by conventing the digital signal increasing during the other half cycle CT3 into an analog voltage.

The PWM controller 100 generates a first PWM output PWM1 as a result of comparison between the reference sinewave SIN and the sawtooth wave SAW and a second PWM output PWM2 as a result of comparison between the inverse reference sinewave RSIN and the sawtooth wave SAW. The PWM controller 100 includes a first PWM comparator 110 and a second PWM comparator 120.

The first PWM comparator 110 generates the first PWM output PWM1 according to a result of comparison between the reference sinewave SIN input to a non-inverse terminal (+) and the sawtooth wave SAW input to an inverse terminal (−).

The second PWM comparator 120 generates the second PWM output PWM2 according to a result of comparison between the inverse reference sinewave RSIN input to a non-inverse terminal (+) and the sawtooth wave SAW input to an inverse terminal (−). The first and second PWM comparators 110 and 120 output high-level outputs when the input of the non-inverse terminal (+) is higher than the input of the inverse terminal (−), and outputs low-level outputs in the opposite case.

The logical operator 200 generates a first gate signal VC1 and a second gate control signal VC2 to control the gate driver 300 using the input pulse INP, the first PWM output PWM1, and the second PWM output PWM2.

The logical operator 200 includes an inverter 210, first to fourth AND gates 220 to 250, and first and second OR gates 260 and 270.

The inverter 210 inverts the input pulse INP. An output of the inverter 210 is called an inverse input pulse INP.

The first AND gate 220 performs AND operation with the first PWM output PWM1 and the input pulse INP. That is, when both of the first PWM output PWM1 and input pulse INP are high level corresponding to logic level 1, a high-level output if the logic level 1 is generated. An output of the first AND gate 220 is called a first logic output LS1.

The second AND gate 230 performs AND operation with the first PWM output PWM1 and the inverse input pulse INPB. That is, when both of the first PWM output PWM1 and the inverse input pulse INPB are high level corresponding to the logic level 1, a high-level output of the logic level 1 is generated. An output of the second AND gate 230 is called a second logic output LS2.

The third AND gate 240 performs AND operation with the second PWM output PWM2 and the input pulse INP. That is, when both of the second PWM output PWM2 and the input pulse INP are high level corresponding to the logic level 1, a high-level output of the logic level 1 is generated. An output of the third AND gate 240 is called a third logic output LS3.

The fourth AND gate 250 performs AND operation with the second PWM output PWM2 and the inverse input pulse INP. That is, when both of the second PWM output PWM2 and the inverse input pulse INP are high-level corresponding to the logic level 1, a high-level output of the logic level 1 is generated. An output of the fourth AND gate 250 is called a fourth logic output LS4.

The first OR gate 260 generates the first gate control signal VC1 that controls the switching operation of the first and third switches S1 and S3 by performing OR operation with the first logic output LS1 and the fourth logic output LS4. That is, when at least one of the first and fourth logic outputs LS1 and LS4 is high level of the logic level 1, the first gate control signal VC1 is high level.

The second OR gate 270 generates the second gate control signal VC2 that controls switching operation of the second and fourth switches S2 and S4 by performing OR operation with the second and third logic outputs LS2 and LS3. That is, when at least one of the second and third logic levels LS2 and LS3 is high level of the logic level 1, the second gate control signal VC2 is high level.

The gate driver 300 generates a first gate voltage QA and the third gate voltage QC according to the first gate control signal VC1, and generates a second gate voltage QB and a fourth gate voltage QD according to the second gate control signal VC2. In this case, the first gate voltage QA and the third gate voltage QC may be opposite to each other in phase, and the second gate voltage QB and the fourth gate voltage QD may be opposite to each other in phase.

The gate driver 300 includes first and second inverters 310 and 320 and first and second buffers 330 and 340.

The first inverter 310 generates the first gate voltage QA by inverting the first gate control signal VC1, and the second inverter 320 generates the second gate voltage QB by inverting the second gate control signal VC2.

The first buffer 330 generates the fourth gate voltage QD by shifting an output level according to the second gate control signal VC2, and the second buffer 340 generates the third gate voltage QC by shifting an output level according to the first gate control signal VC1. The output level implies a sufficient level for turning on or turning off the third and fourth switches S3 and S4.

Operation of the switch controller 30 will now be described with reference to FIG. 3 and FIG. 4.

Figure 3:
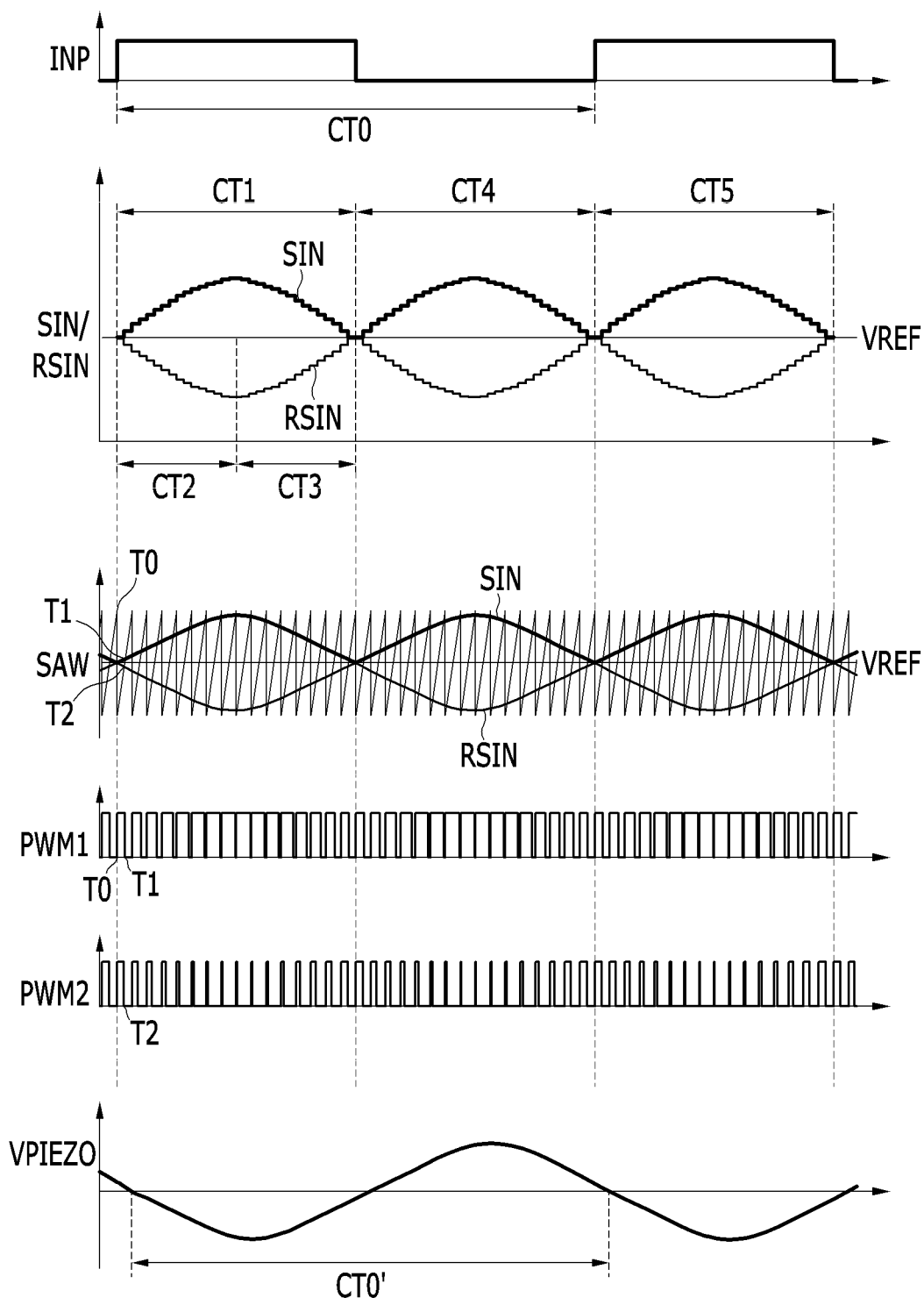
FIG. 3 is a waveform diagram of an input pulse, a reference sine wave, a sawtooth wave, a first PWM output, a second PWM output, and a piezoelectric voltage according to the exemplary embodiment of the present invention.

FIG. 3 is a waveform diagram of the input pulse, the reference sinewave, the inverse reference sinewave, the sawtooth wave, the first PWM output, the second PWM output, and the piezoelectric voltage according to the exemplary embodiment of the present invention.

Figure 4:
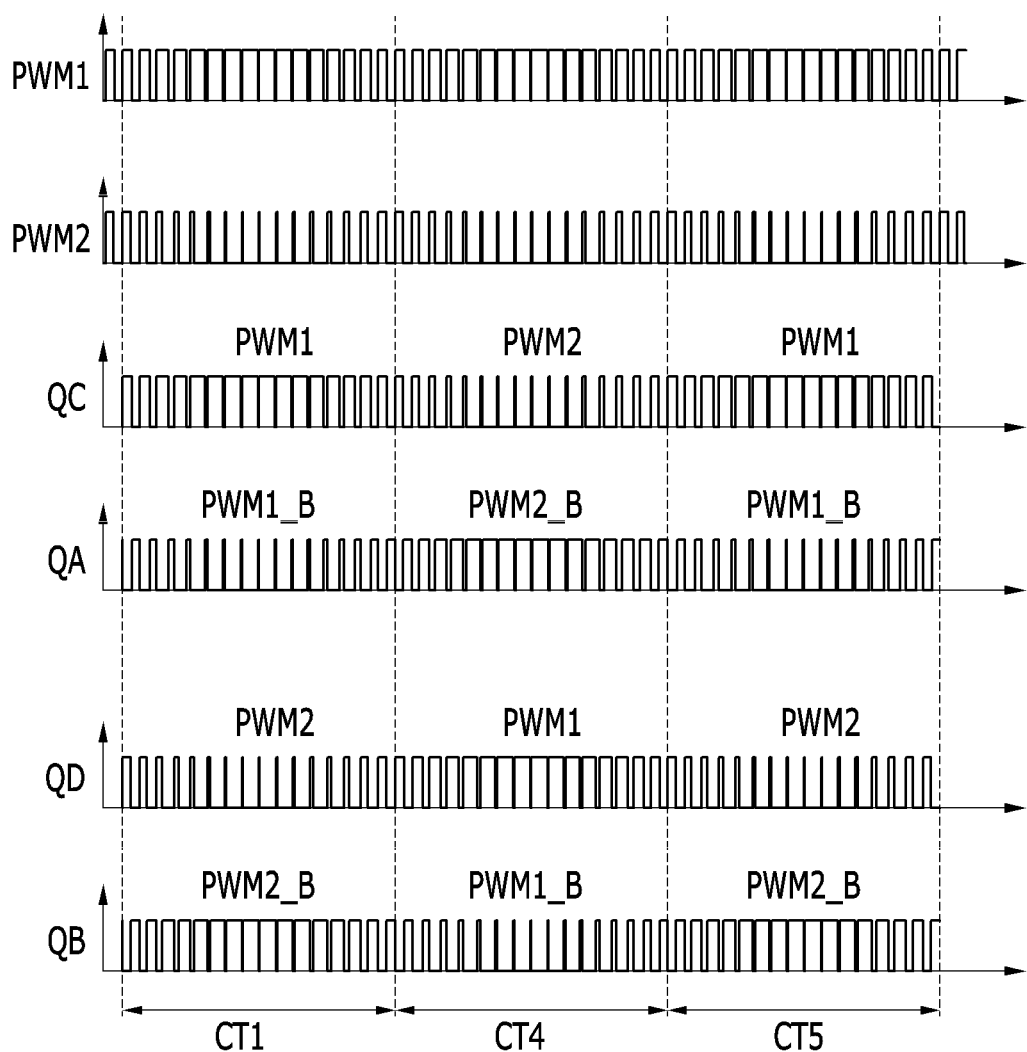
FIG. 4 is a waveform diagram of a first PWM output, a second PWM output, and first to fourth gate voltages according to the exemplary embodiment of the present invention.

FIG. 4 is a waveform of the first PWM output, the second PWM output, and the first to fourth gate voltages according to the exemplary embodiment of the present invention.

A cycle CT0' of the piezoelectric voltage VPIEZO is controlled to be equal to one cycle CT0 of the input pulse INP. The reference sinewave SIN is increased and then decreased and the inverse reference sinewave RSIN is decreased and then increased during the cycle CT1 that corresponds to the half of the cycle CT0. FIG. 3 exemplarily illustrates a phase difference of the piezoelectric voltage VPIEZO and the input pulse INP, and the present invention is not limited thereto.

The reference sinewave SIN and the inverse reference sinewave RSIN can be generated by the digital signal into the analog voltage, and conversion is illustrated as a step shape. However, the step shape is provided for better understanding. Substantially, the reference sinewave and the inverse reference sinewave are set as smooth curved lines overlapped with the sawtooth wave SAW as shown in FIG. 3 by controlling a frequency of a digital signal. Hereinafter, the saw wave and the reference sinewave SIN and the inverse reference sinewave RSIN compared by the comparator 110 are set as curved lines.

The reference sinewave SIN and the inverse reference sinewave RSIN have opposite phase with reference to a reference voltage VREF, and the reference voltage VREF is the middle of the peak and the lowest value of the sawtooth wave SAW.

The first PWM output PWM1 is increased to high level at T0 that the sawtooth wave SAW is lower than the reference sinewave SIN, and is decreased to low level at T1 that the sawtooth wave SAW is higher than the reference sinewave SIN. Thus, a pulse width of the first PWM output PWM1 is increased during a period CT2 during which the reference sinewave SIN is increased, and the pulse width of the first PWM output PWM1 is decreased during a period CT3 during which the reference sinewave SIN is decreased.

The second PWM output PWM2 is increased to high level at T0 that the sawtooth wave SAW is lower than the inverse reference sinewave RSIN, and decreased to low level at a time point (e.g., T2) that the sawtooth wave SAW is higher than the inverse reference sinewave RSIN. Thus, a pulse width of the second PWM output PWM2 is decreased during the period CT2 during which the inverse reference sinewave RSIN is decreased, and the pulse width of the second PWM output PWM2 is increased during the period CT3 during which the inverse reference sinewave RSIN is increased.

For the period CT1 during which the input pulse INP is high level, the second and fourth logic outputs LS2 and LS4 of the second and fourth AND gates 230 and 250 to which the inverse input pulse INP is input are low level. Thus, an output of the first OR gate 260 is determined according to the first logic output LS1 and an output of the second OR gate 270 is determined according to the third logic output LS3.

Since the first logic output LS1 is determined according to the first PWM output PWM1, the first gate control signal VC1 is determined according to the first PWM output PWM1. As shown in FIG. 4, during the period CT1, the first gate voltage QA is an inverse output of the first gate control signal VC1, and therefore the first gate voltage QA is determined according to an inverse phase PWM1_B of the first PWM output PWM1, and the third gate voltage QC is determined according to the first gate control signal VC1, and therefore the third gate voltage QC is determined according to the phase of the first PWM output PWM1.

Since the third logic output LS3 is determined according to the second PWM output PWM2, the second gate control signal VC2 is determined according to the second PWM output PWM2. As shown in FIG. 4, during the period CT1, the second gate voltage QB is an inverse output of the second gate control signal VC2, and therefore the second gate voltage QB is determined according to an inverse phase PWM2_B of the second PWM output PWM2, and the fourth gate voltage QD is determined according to the second gate control signal VC2, and therefore the fourth gate voltage QD is determined according to the phase of the second PWM output PWM2.

For the period CT4 during which the input pulse INP is low level, the first and third logic outputs LS1 and LS3 of the first and third AND gates 220 and 240 to which the input pulse INP is input are low level. Thus, an output of the first OR gate 260 is determined according to the fourth logic output LS4 and an output of the second OR gate 270 is determined according to the second logic output LS2.

Since the fourth logic output LS4 is determined according to the second PWM output PWM2, the first gate control signal VC1 is determined according to the second PWM output PWM2. As shown in FIG. 4, during the period CT4, the first gate voltage QA is an inverse output of the first gate control signal VC1, and therefore the first gate voltage QA is determined according to the inverse phase PWM2_B of the second PWM output PWM2, and the third gate voltage QC is determined according to the first gate control signal VC1, and therefore the third gate voltage QC is determined according to the phase of the second PWM output PWM2.

Since the second logic output LS2 is determined according to the first PWM output PWM1, the second gate control signal VC2 is determined according to the first PWM output PWM1. As shown in FIG. 4, during the period CT4, the second gate voltage QB is an inverse output of the second gate control signal VC2, and therefore the second gate voltage QB is determined according to the inverse phase PWM1_b of the first PWM output PWM1, and the fourth gate voltage QD is determined according to the second gate control signal VC2, and therefore the fourth gate voltage QD is determined according to the first PWM output PWM1.

As described, for the period during which the input pulse INP is high level, the first switch 51 is controlled according to the inverse (i.e., PWM1_B) of the first PWM output, the third switch S3 is controlled according to the first PWM output PWM1, the second switch S2 is controlled according to the inverse (i.e., PWM2_B) of the second PWM output, and the fourth switch S4 is controlled according to the second PWM output PWM2.

For the period during which the input pulse INP is low level, the first switch 51 is controlled according to the inverse (i.e., PWM2_B) of the second PWM output, the third switch S3 is controlled according to the second PWM output PWM2, the second switch S2 is controlled according to the inverse (i.e., PWM1_B) of the first PWM output, and the fourth switch S4 is controlled according to the first PWM output PWM1.

As described, the piezoelectric voltage VPIEZO is controlled to be determined according to the sinewave by controlling the switches of the pull-bridge circuit of the piezoelectric driving circuit 20. The peak current generated during switching operation performed when the piezoelectric voltage VPIEZO is determined by the sinewave is decreased compared to the case that the piezoelectric voltage VPIEZO is determined by a square wave.

In the exemplary embodiment of the present invention, the first gate voltage QA and the second gate voltage QB are generated by inverting the first gate control signal VC1 and the second gate control signal VC2, but the present invention is not limited thereto.

For example, the first gate voltage QA may be generated according to the first gate control signal VC1, the third gate voltage may be generated by inverting the first gate control signal VC1, the second gate voltage QB may be generated according to the second gate control signal VC2, and the fourth gate voltage QD may be generated by inverting the second gate control signal VC2. Then, a piezoelectric voltage having an inverse phase of the phase of the piezoelectric voltage VPIEZO shown in FIG. 3 is generated.

In the exemplary embodiment of the present invention, the first PWM output and the second PWM output are generated using the sawtooth wave, but the present invention is not limited thereto. A triangle wave may be used instead of the sawtooth wave.

Figure 5:
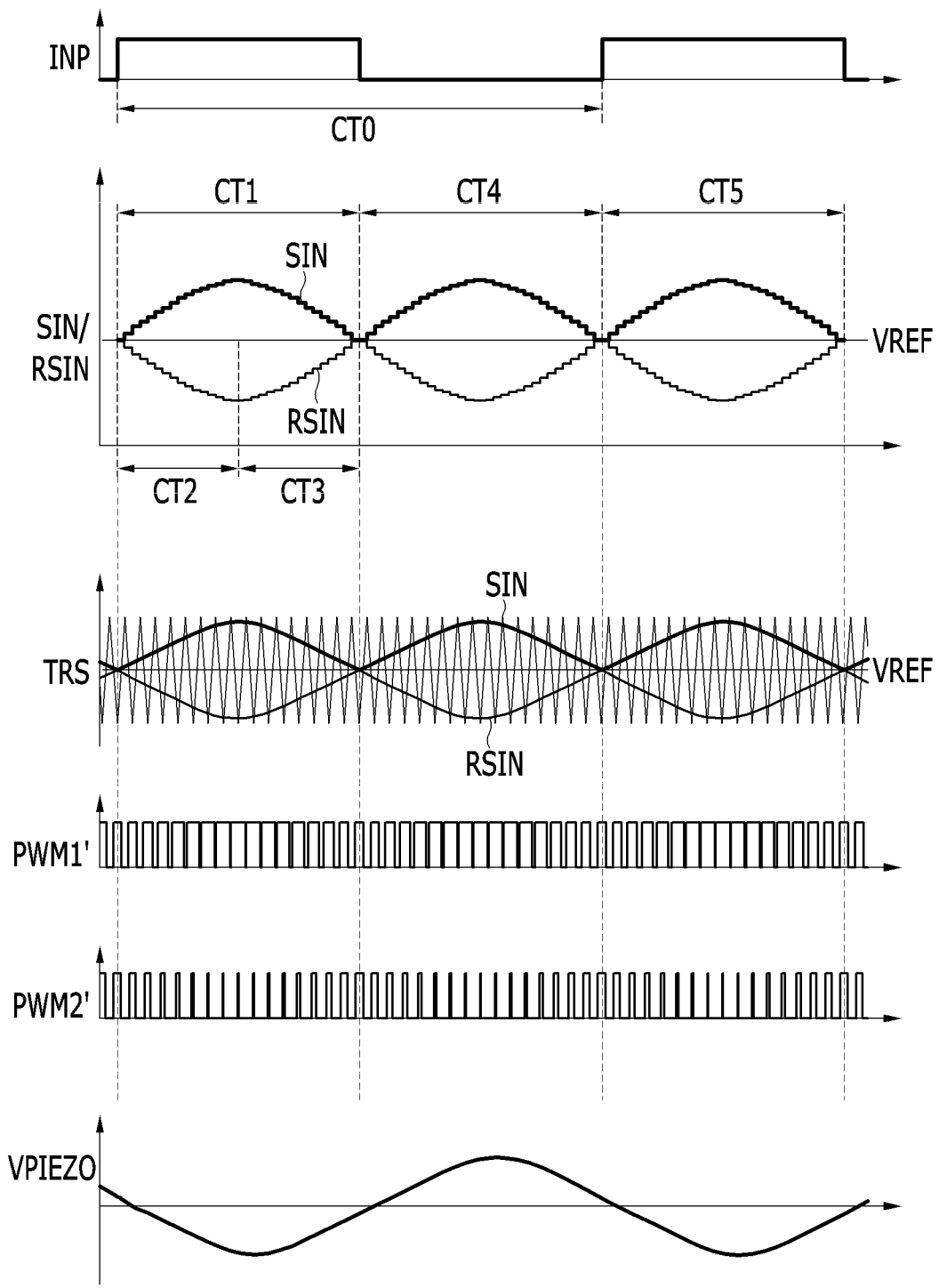
FIG. 5 is a waveform diagram of an input pulse, a reference sine wave, an inverse reference sine wave, a triangular wave, a first PWM output, a second PWM output, and a piezoelectric voltage according to another exemplary embodiment of the present invention.

FIG. 5 is a waveform diagram of an input pulse, a reference sinewave, an inverse reference sinewave, a triangle wave, a first PWM output, a second PWM output, and a piezoelectric voltage according to another exemplary embodiment of the present invention.

As shown in FIG. 5, a first PWM output PWM1' is high level when a reference sinewave SIN is higher than a triangle wave TRS and low level in the opposite case, and a second PWM output PWM2' is high level when an inverse reference sinewave RSIN is higher than the triangle wave TRS and low level in the opposite case.

As shown in FIG. 5, when using the triangle wave TRS is used, the first PWM output PWM1' and the second PWM output PWM2' are similar to the first and second PWM outputs PWM1 and PWM2 generated using the sawtooth wave SAW. A switch controller according to the other exemplary embodiment of the present invention may generate first to fourth gate voltages QA, QB, QC, and QD using the first and second PWM outputs PWM1' and PWM2'. Configuration and operation of the switch controller is similar to the switch controller of FIG. 2, and therefore no further description will be provided.

The piezoelectric driving circuit according to the exemplary embodiments of the present invention can reduce input power compared to a conventional piezoelectric driving circuit by reducing the peak current. In further detail, mechanical energy of the piezoelectric element, for example, a voltage that determines vibration is both-end voltages of the capacitor CA. The input power according to the exemplary embodiment of the present invention is lower than input power for acquiring sufficient both-end voltages of the capacitor CA in the conventional piezoelectric element. Therefore, necessary electric energy for acquiring the same amount of mechanical energy is low compared to the conventional piezoelectric element.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS piezoelectric element 10, inductor L, first capacitor CA, second capacitor CB
resistor R, piezoelectric driving circuit 20, body diode BD1-BD4
parasitic capacitor (C1-C4), first switch to fourth switch S1-S4
series-resonance circuit 11, switch controller 30, PWM controller 100
logical operator 200, gate driver 300, signal generator 400
first PWM comparator 110, second PWM comparator 120, inverter 210
first to fourth AND gate 220-250, first and second OR gate 260 and 270
first and second inverter 310 and 320, first and second buffer 330 and 340

What is claimed is:

1. A piezoelectric driving circuit comprising:
a full-bridge circuit including first and third switches connected to a first terminal of a piezoelectric element and second and fourth switches connected to a second terminal of the piezoelectric element; and
a switch controller configured to:
generate a first pulse width modulation (PWM) output according to a comparison between a ramp signal that controls a switching frequency and a reference sine wave that controls a cycle of a piezoelectric voltage;
generate a second PWM output according to a comparison between the ramp signal and an inverse of the reference sine wave;
control the first and third switches according to the first PWM output during a first cycle of the reference sine wave and the inverse of the reference sine wave;
control the second and fourth switches according to the second PWM output during the first cycle of the reference sine wave;
control the first and third switches according to the second PWM output during a second cycle of the reference sine wave; and
control the second and fourth switches according to the first PWM output during the second cycle of the reference sine wave.

2. The piezoelectric driving circuit of claim 1, wherein the first switch is connected between a DC voltage supply and the first terminal of the piezoelectric element, the second switch is connected between the DC voltage supply and the second terminal of the piezoelectric element, the third switch is connected between the first terminal of the piezoelectric element and a ground, and the fourth switch is connected between the second terminal of the piezoelectric element and the ground.

3. The piezoelectric driving circuit of claim 1, wherein the switch controller is to generate an input pulse having a predetermined cycle, and the switch controller comprises a piezoelectric driving circuit to generate the reference sine wave having a cycle that is nominally equal to the cycle of the input pulse and to the inverse of the reference sine wave.

4. The piezoelectric driving circuit of claim 3, wherein one cycle of the reference sine wave and one cycle of the inverse reference sine wave is equal to half of the cycle of the input pulse.

5. The piezoelectric driving circuit of claim 3, wherein the switch controller further comprises:
a PWM controller to generate the first PWM output based on the ramp signal and the reference sine wave and to generate the second PWM output based on the ramp signal and the inverse reference sine wave;
a logical operator configured to generate:
a first gate control signal according to the first PWM output and a second gate control signal according to the second PWM output when the input pulse is a first level;
the second gate control signal according to the first PWM output and the first gate control signal according to the second PWM output when the input pulse is a second level; herein
the switch controller is to control the gate voltage of the first and third switch using the first gate control signal;
and the switch controller is to control the gate voltage of the second and fourth switch using the second gate control signal.

6. The piezoelectric driving circuit of claim 5, wherein the switch controller further comprises a gate driver configured to generate:
the first gate voltage of the first switch by inverting the first gate control signal;
the third gate voltage of the third switch equal to the first gate control signal;
the second gate voltage of the second switch by inverting the second gate control signal; and
the fourth gate voltage of the fourth switch equal to the second gate control signal.

7. The piezoelectric driving circuit of claim 5, wherein the PWM controller comprises:
a first PWM comparator including an inversion terminal to which the ramp signal is input and a non-inversion terminal to which the reference sine wave is input, the first PWM comparator to generate a high-level first PWM output when the input of the non-inversion terminal is higher than the input of the inversion terminal and the first PWM comparator to generate a low-level first PWM output when the input of the non-inversion terminal is lower than the input of the inversion terminal; and
a second PWM comparator including an inversion terminal to which the ramp signal is input and a non-inversion terminal to which the inverse reference sine wave is input, the second PWM comparator to generate a high-level second PWM output when the input of the non-inversion terminal is higher than the input of the inversion terminal and the second PWM comparator to generate a low-level second PWM output when the input of the non-inversion terminal is lower than the input of the inversion terminal.

8. The piezoelectric driving circuit of claim 5, wherein the logical operator comprises:
a first AND gate to perform an AND operation with the first PWM output and the input pulse;
a second AND gate to perform an AND operation with the first PWM output and the inverse input pulse;
a third AND gate to perform an AND operation with the second PWM output and the input pulse;
a fourth AND gate to perform an AND operation with the second PWM output and the inverse input pulse;
a first OR gate to generate the first gate control signal by performing OR operation with an output of the first AND gate and an output of the fourth AND gate; and
a second OR gate to generate the second gate control signal by performing OR operation with an output of the second AND gate and an output of the third AND gate.

9. The piezoelectric driving circuit of claim 8, wherein the logical operator further comprises an inverter to generate the inverse input pulse by inverting the input pulse.

10. The piezoelectric driving circuit of claim 1, wherein the ramp signal is a sawtooth wave or a triangle wave.

11. A method for driving a piezoelectric driving circuit including first and third switches connected to a first terminal of a piezoelectric element and second and fourth switches connected to a second terminal of the piezoelectric element, comprising:
   generating a first pulse width modulated (PWM) output according to a comparison between a ramp signal that controls a switching frequency and a reference sine wave that controls a cycle of a piezoelectric voltage;
   generating a second PWM output according to a comparison between the ramp signal and an inverse of the reference sine wave;
   controlling the first and third switches according to the first PWM output during a first cycle of the reference sine wave and the inverse of the reference sine wave;
   controlling the second and fourth switches according to the second PWM output during the first cycle of the reference sine wave;
   controlling the first and third switches according to the second PWM output during a second cycle of the reference sine wave; and
   controlling the second and fourth switches according to the first PWM output during the second cycle of the reference sine wave.

12. The method of claim 11, further comprising generating an input pulse having a predetermined cycle and generating the reference sine wave having a cycle that is nominally equal to the cycle of the input pulse and the inverse of the reference sine wave.

13. The method of claim 12, wherein one cycle of the reference sine wave and the inverse of the reference sine wave is equal to the half of the cycle of the input pulse.

14. The method of claim 12, wherein the generating the first PWM output comprises comparing the ramp signal and the reference sine wave, and generating the second PWM output comprises comparing the ramp signal and the inverse of the reference sine wave.

15. The method of claim 12, wherein controlling the first and third switches during the first cycle comprises:
   generating a first gate control signal according to the first PWM output when the input pulse is a first level;
   generating a first gate voltage of the first switch by inverting the first gate control signal; and
   generating a third gate voltage of the third switch according to the first gate control signal.

16. The method of claim 12, wherein controlling the second and fourth switches during the first cycle comprises:
   generating a second gate control signal according to the second PWM output when the input pulse is a first level;
   generating a second gate voltage of the second switch by inverting the second gate control signal; and
   generating a fourth gate voltage of the fourth switch according to the second gate control signal.

17. The method of claim 12, wherein controlling the first and third switches during the second cycle comprises:
   generating a second gate control signal according to the first PWM output when the input pulse is a second level;
   generating a second gate voltage of the second switch by inverting the second gate control signal; and
   generating a fourth gate voltage of the fourth switch according to the second gate control signal.

18. The method of claim 12, wherein the controlling the second and fourth switches during the second cycle comprises:
   generating a first gate control signal according to the second PWM output when the input pulse is a second level;
   generating a second gate voltage of the second switch by inverting the first gate control signal; and
   generating a fourth gate voltage of the fourth switch according to the first gate control signal.

19. The method of claim 15, wherein one cycle of the reference sine wave and the inverse of the reference sine wave is equal to half of the cycle of the input pulse.

20. The method of claim 11, wherein the ramp signal is a sawtooth wave or a triangle wave.

* * * * *